United States Patent

[11] 3,579,232

[72] Inventors Pierre Girard
Paris;
Claude Paul Henri Lerouge, Maurepas;
Marc Andre Regnier, Aulnay-Sous-Bois,
France
[21] Appl. No. 818,554
[22] Filed Apr. 23, 1969
[45] Patented May 18, 1971
[73] Assignee International Standard Electric Corporation
New York, N.Y.
[32] Priority Apr. 30, 1968
[33] France
[31] 150085

[54] NON-LINEAR DIGITAL TO ANALOG DECODER WITH A SMOOTH CHARACTERISTIC
6 Claims, 5 Drawing Figs.

[52] U.S. Cl. .......... 340/347
[51] Int. Cl. .......... H03k 13/04
[50] Field of Search .......... 235/154, 150.5, 150.53; 340/347

[56] References Cited
UNITED STATES PATENTS

| | | | |
|---|---|---|---|
| 3,296,611 | 1/1967 | Kaneko | 340/347 |
| 3,298,017 | 1/1967 | Avignon et al. | 340/347 |
| 3,305,857 | 2/1967 | Barber | 340/347 |
| 3,310,799 | 3/1967 | Ohashi | 340/347 |
| 3,366,947 | 1/1968 | Kawashima et al. | 340/347 |
| 3,377,586 | 4/1968 | Kaneko | 340/347 |
| 3,396,380 | 8/1968 | Ohashi | 340/347 |

*Primary Examiner*—Maynard R. Wilbur
*Assistant Examiner*—Gary R. Edwards
*Attorneys*—C. Cornell Remsen, Jr., Walter J. Baum, Percy P. Lantzy, J. Warren Whitesel, Delbert P. Warner and James B. Raden

ABSTRACT: A digital to analog decoder or converter is disclosed. The decoder has a smooth nonlinear characteristic of the hyperbolic sine type. This smooth characteristic is contrasted to a nonlinear characteristic approximated by a plurality of straight line segments in the prior art. The decoder of this case includes a register to store a 7-digit code to be decoded. A first decoder circuit decodes the last four digits of the 7-digit code. Two groups of current generators (a first selection circuit) responding to the output of the first decoder produce two currents. A bipolar inverter (a second selection circuit) responding to the first of the last four digits directs the two currents to a third selection circuit. The third selection circuit responds to the output of of a second decoder to direct the two currents to the appropriate one of two ladder attenuators, the outputs of which produce the analog signal. The second decoder responds to the first three digits of the 7-digit code.

P. GIRARD
C. P. H. LEROUGE
M. A. REGNIER
Inventors

By DB Warner
Attorney

Patented May 18, 1971

3,579,232

3 Sheets-Sheet 2

NON-LINEAR DIGITAL TO ANALOG DECODER WITH A SMOOTH CHARACTERISTIC

The present invention concerns a nonlinear digital to analog decoder with a smooth logarithmic characteristic, i.e. that to each code corresponds a particular point of said characteristic. the curvature of which varying thus in a continuous way.

Such a nonlinear decoder may be used first as a decoder-expander, and second as a decoder associated to a nonlinear feedback coder.

It will be reminded that, in a feedback coder, the analog value of a number stored in a register is compared to the signal to be coded, which enables to determine whether the number is too big or too small. In the first case, this number is reduced, in the second case it is increased. These comparison operations are carried on up to the time where all the compared voltages differ, at most, only by the value of one quantizing step.

When the used decoder is nonlinear, the coding is carried out according to a nonlinear characteristic. Since the same decoder may be used for the coding and for the decoding, compression and expansion characteristics are then perfectly matched if said decoder presents stable and reproducible characteristics.

Nonlinear decoders with a smooth characteristic using a resistance network and enabling to obtain an hyperbolic or logarithmic characteristic are well known.

In the case of an hyperbolic decoder, one utilizes a resistance network, the extreme values of which are in the ratio of $2^n$, these resistances being switched in accordance with the value of the number to be decoded.

However, it is known that any resistance presents a reactance which depends upon its value. At high frequencies, the effect of this reactance becomes important, and the value of the corresponding impedance depends upon the number to be decoded. It is thus realized that a decoder, comprising resistances the values of which are so dissimilar, is difficult to achieve, and cannot present a high accuracy.

Besides, when an electronic gate is used for sampling the signal to be coded, this latter presents, when it is activated, a series resistance which is not negligible with respect to the resistances of low value of the network, and which introduces a new source of errors.

Nonlinear decoders with discontinuous or "multilinear" characteristics are also known, these expressions defining a curve symmetrical with respect to the origin constituted by a series of segments of different slopes.

In this type of decoder, the mode of obtention of the decoded voltage differs substantially from that used in the decoders of the first type.

In fact, the network of resistances is organized in a ladder attenuator comprising a certain number of identical cells so that the weighting is obtained without using resistances of different values and that the accuracy obtained is very high.

In the two types of decoders just described, the nonlinear companding law is followed only in an approximate way, in particular when said law is approximated by the segments which sustain the arcs of the characteristic curve, and it is understood that the curve is followed the better as the number of segments is the higher.

In several French Pat. Nos. 1,357,668 (M.L. Avignon-A.Y. Le Maout 1-1) and 1,460,676 (A.E.J. Chatelon 17), multilinear decoders have been described, which present characteristics perfectly stable and reproducible, but the performances of which depart fairly substantially from the optimum performances which may be obtained with decoders having a smooth characteristic.

On the contrary, in the French Pat. No. 1,518,778 (C.P.H.Lerouge-D.C. Strube 8—3), one has described a nonlinear decoder circuit with a smooth characteristic, the compression law of which $y=f(x)$ presents a logarithmic form, $y$ and $x$ representing respectively the normalized amplitudes of the signal which corresponds to a linear decoding of the number and of the signal delivered by the nonlinear decoder. This law of compression is:

$$x=\frac{(k+1)^y-1}{k} \quad (1)$$

the coefficient $k$ having a high value. This coefficient, which defines the curvature of the characteristic, is called sometimes "compression parameter." It will be reminded that this law has been proposed by Smith and Bernard in the article entitled "Instantaneous Companding of Quantized Signals," which has been published in 1957, pages 653 to 709, in the review "Bell System Technical Journal."

In this decoder, provided for processing numbers comprising $n=n1+n2$ digits, one decodes separately the group of $n1$ digits ($2^{n1}$ outputs) and the group of $n2$ digits ($2^{n2}$ outputs), and all the possible combinations, two-by-two, of these outputs define the $2^n$ numbers of the code. A smooth characteristic is then obtained by controlling first the choice of one current out of $2^{n1}$ currents with the signal delivered by the first decoder and second the choice of one attenuation ratio out of $2^{n2}$, this attenuation ratio being applied to the current chosen. The shape of the characteristic curve of the decoder, i.e. the equation to which it corresponds, is determined by the respective values of the $2^{n1}$ currents and of the $2^{n2}$ attenuation ratios. The decoded numbers are expressed in the symmetrical natural binary code characterized by the fact that the most significant digit represents the sign of the voltage to be coded, and the ($n$-1) other digits represent the absolute value of this voltage.

In the present invention, a nonlinear decoding circuit is described with a smooth characteristic corresponding to the logarithmic compression law:

$$x=\frac{m^y-m^{-y}}{m(1-1/m)} \quad (2)$$

in which expression the parameter $m$, which has a high value, defines the curvature of the characteristic. This law of compression has been proposed by H. Kaneko and T. Sekimoto in the article titled "Logarithmic PCM Encoding Without Diode Comparator," published in 1963 in the publication "IEEE International Convention Record," part 3, pages 266 to 281.

This compression law presents, with respect to that defined by the equation (1) the following advantages:

- Better constancy of the ratio $\Delta x/x$, $\Delta x$ being the quantizing step;
- Slope at the origin twice lower, so that the minimum value of $\Delta x$ is higher. It results therefrom that, in a coder, one may use a less sensitive comparator;
- The signal-to-noise ratio is more uniform in the decoding range if it is assumed that the distribution of the amplitude of the analog signal follows a decreasing exponential law.

Besides, this decoding circuit processes numbers in natural binary code, the normalized amplitude $x=0$ corresponding to the numbers $2^{n-1}$ and $2^{n-1}-1$ to the nearest half quantizing step.

The object of the present invention is thus to achieve a nonlinear decoder with a smooth characteristic for numbers written in natural binary code.

Another object of the invention lies upon the fact that a nonlinear correspondence law is chosen $$x=\frac{m^y-m^{-y}}{m-1/m} \quad (3)$$

assuring a high constancy of the ratio $\Delta x/x$ and in which the central part of the characteristic is quasi linear.

For the nonlinear decoding, according to the equation (3) of a number comprising $n=n1+n2$ digits, $n1$ and $n2$ representing groups of consecutive digits, it is a feature of the invention that the decoder includes firstly a $n$-digit register, secondly selection circuits comprising a primary selection decoder associated to the group of $n1$ digits which comprises $2^{n1}$ outputs, a tertiary selection decoder associated to the group of $n2$ digits which comprises $2^{n2-1}$ outputs and a secondary selection decoding assured by the state of the more significant flip-flop of the group of $n2$ digits, the ensemble of these three selections enabling to define unambiguously a number out of $2^n$, thirdly two current generating units LG and RG, comprising each $2^{n2-1}$ current generators, the currents of which increase in geometrical progression of ratio $d1=m^{-(n-1)}$, a generator being selected in each unit by a tertiary selection signal out of $2^{n2-1}$, fourthly a switching circuit equivalent to a bipolar inverter which transmits the currents supplied by the units LG and RG on its outputs F$p$ and F$n$, or reversely, said switching being controlled by the secondary selection signal, and fifthly, two selection circuits each one equivalent to a $2^{n1}$ direction switch which transmits the currents appearing on the outputs F$p$ and F$n$ respectively to one input of a positive attenuator and to one input of a negative attenuator of characteristic impedance Z, each of said circuits being a ladder attenuator with $2^{n1}$ cells with an attenuation ratio of $d2=m^{-(n1-1)}$ per cell, the selection being controlled by the primary selection signal.

Another feature of the invention is that, if one chooses $n=7$, $n1=A3$, $n2=4$, both units LG and RG comprise sixteen generators I0, I1, ... I15, delivering currents which increase, from the current I0, in geometrical progression of ratio $d1=m^{1/64}$, that the units LG and RG group, respectively, the generators I0 to I7 and I8 to I15, that the symmetrical generators in the two blocks, for instance the generators I0 and I15, I1 and I14, etc., are triggered by the same tertiary selection signal, that the generators I0 and I15 are triggered when the less significant $n2=4$ digits of the number applied to the tertiary selection decoder have the value 0000 or 1111 characterizing, respectively the lower and the higher code of a zone of numbers, that the generators I1 and I14 are triggered when said digits characterize the code adjacent to said extreme codes, etc., that the choice between the two code values is carried out under the control of the secondary selection signal constituted by the value of the most significant digit of the group of $n2$ digits, the current supplied by the unit LG being directed towards the output F$p$ (F$n$) of the secondary selection circuit if this digit is 1 (0) and the current supplied by the block of generators RG being directed towards the output F$n$ (F$p$) of said circuit if this digit is 1 (0).

Another feature of the invention is that the $2^{n1}=8$ signals delivered by the primary selection decoder to which are applied the $n1$ most significant digits of the number define eight zones Z$n$4 to Z$n$1, Z$p$1 to Z$p$4, the zone Z$n$4 corresponding to the number zero and the zone Z$p$4 to the maximum number, that each of the attenuators comprises eight injection points referenced Q0 to Q7 for the positive attenuator and Q'0 to Q'7 for the negative attenuator, a current I$p$ producing, at the output of the attenuator, a voltage X$p$ (X$n$)=ZI$p$ when it is injected in Q0 (Q'0), a voltage X$p$ (X$n$)=$d2$.ZI$p$ when it is injected in Q1 (Q'1) etc.. with $d2=m^{1/4}$, that the primary selection signal Z$p$4 (Z$n$4) controls the switching of the currents supplied by the inverter AS on its outputs F$p$ (F$n$) and F$n$ (F$p$) respectively towards the injection points Q7 (Q'7) and Q'0 (Q0), that the signal Z$p$3 (Z$n$3) controls the switching of the currents supplied by said inverter on its outputs F$p$ (F$n$) and F$n$ (F$p$) respectively towards the injection points Q6 (Q'6) and Q'1 (Q1) etc.. and that the decoded voltage $x$ is represented, in magnitude and sign, by the potential difference between the output terminals X$p$ and X$n$ of the two attenuators.

Another feature of the invention is that the $n1$ digits, for instance, may be the most significant or the less significant digits of the number, provided the smallest of the numbers $n1$ and $n2$ is greater than 1.

The above mentioned and other features and objects of this invention will become apparent by reference to the following description taken in conjunction with the accompanying drawings in which.

Figure 1:
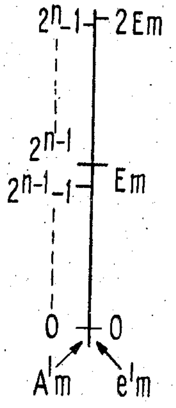
FIG. 1 represents a first type of correspondence between the numbers to be decoded and the voltages which correspond thereto in a linear way.

In order to facilitate the reading of the description, this latter is divided into four parts:

1. Principle
1.1–Methods of linear decoding of a number
1.2–Characteristic curve of the nonlinear decoder according to the invention
2. Description
2.1–General diagram
2.2–Ladder attenuator
2.3–Switching circuits
3. Operation
3.1–Calculation of the negative values of exponents
3.2–Elaboration of the voltages $xp$ and $xn$
4. Alternative solutions
4.1–First alternative
4.2–Second alternative
4.3–Generalization

1. PRINCIPLE

1.1–Methods of Linear Decoding of a Number

We shall consider a decoder receiving numbers A$m$ in natural binary code comprising $n$ digits. The whole of the $2^n$ numbers of the code represents voltages ranging between zero and 2E$m$.

FIG. 1 represents a first type of linear decoding of the numbers A$m$ to which correspond voltages $e'm$ with amplitudes which increase with the value of the numbers. Thus the number zero corresponds to a voltage $e'm=A0$, the number $2^{n-1}$ corresponds to a voltage $e'm$=E$m$ and the number $2^n$—1 corresponds to the maximum voltage minus one quantizing step.

Figure 2:
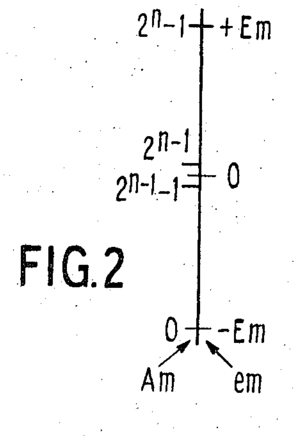
FIG. 2 represents a second type of correspondence between the the numbers to be coded and the voltages which correspond thereto in a linear way.

FIG. 2 represents a second type of linear decoding of the numbers A$m$ to which correspond voltages $em$ with amplitudes which increase on both sides of the value $em$=O placed between the central numbers $2^{n-1}$—1 and $2^{n-1}$ with extreme values equal to ±E$m$.

In order to write the algebraic equations representing these two types of linear decoding, one will set that $n$32 7 and that the number A$m$ is stored in a register comprising the flip-flops B1, B2 ... B7. The fact that the flip-flop B$j$ is in the 1 state is represented by the logical condition B$j$ and the fact that it is in the 0 state is represented by the condition $\overline{Bj}$. On the other hand, the seven digits of the number are designated by $b1$, $b2$ ... $b7$, the digit $bj$ having the numeric value 1 for the condition B$j$ or the numeric value zero for the condition $\overline{Bj}$.

Last, one will set:

$$\frac{e'm}{2Em}=y' \text{ and } \frac{em}{2Em}=y$$

The parameters $y'$ and $y$ are thus the normalized values of the decoded voltages.

For the first type of linear decoding (FIG. 1) one may write:

$$y'=b1+2.2^{-1}...........+b^7.2^{-6} \qquad (1)$$

this giving for the number zero: $y'$=0 for the number $2^n$—1: $y'=2-2^{-6}$

It will be noted that the values of these extreme voltages are not symmetrical with respect to the origin point $y'$=1 (point located between the central numbers $2^{n-1}$—1 and $2^{n-1}$) since the maximum value of $y'$ differs of $2^{-6}$ from the theoretical value.

If one adds —1 to the equation (1) another type of decoding is obtained defined by the equation:

$$y=-1+b+b2.2^{-1}+.........b^7.2^{-6} \qquad (1'),$$

this giving for the number zero: $y=-1$ for the number $2^n-1$: $y=+1-2^{-6}$

In this type of decoding, the values of the extreme voltages are again not symmetrical with respect to the origin point $y=0$. Nevertheless, this symmetrization is obtained by adding a positive shift voltage of normalized value $2^{-7}$. One has thus (see FIG. 2):

$$y=-1+b+b2.2^{-1}+\ldots\ldots\ldots+b7.2^{-6}+2^{-7} \qquad (2)$$ and:

for the number zero: $yp=-1+2^{-7}$ for the number $2^n-1$: $yn=+-2^{-7}$

Thus, if $yp$ and $yn$ designate the normalized voltages corresponding to two numbers located at equal distance from the origin (point $em+0$) —these numbers being complementary —, one has $yn=-yp$.

More generally, if P designates the number constituted by the digits $b1$ to to $b7$, one may write:

$y=(2P+1-2^n)2^{-n}$ (2′) with $n=7$ $-y=[2^n(2P+1)]2^{-n}$

If one takes the complement to $2^n-1$ of the number P obtained by complementing its different digits, the value of $y$ —which will be written "$\hat{Y}$"—corresponding to this number $\bar{P}$ is:

$\hat{y}=(2^{n+1}-2P-2+1-2^n)2^{-n}$;

and since $2^{n+1}-2^n=2^n$, $\hat{y}=[2^n-(2P+1)]2^{-n}$ thus $-y=\hat{y}$.

It is thus seen that, in a symmetrical decoding with shift compensation, the negative value of $y$ corresponding to a given number P is equal to the positive value of $y$ corresponding to the complemented number $\bar{P}$.

1.2–Characteristic Curve of the Decoder

A decoder is a device which enables to compute the function $x=f(y)$, $x$ being the normalized amplitude $ed/2Em$ of the decoded signal.

The decoder according to the invention is a nonlinear quantized function generator such as:

$$x=\frac{m^y-m^{-y}}{(m-1/m)} \qquad (3)$$

This equation may be written: $x=xp-xn$ by setting $xp=\frac{m^y}{mo}$ (4′), $xn=\frac{m^{-y}}{mp}$ (5′) and $mo=m-\frac{1}{m}$.

Figure 3:
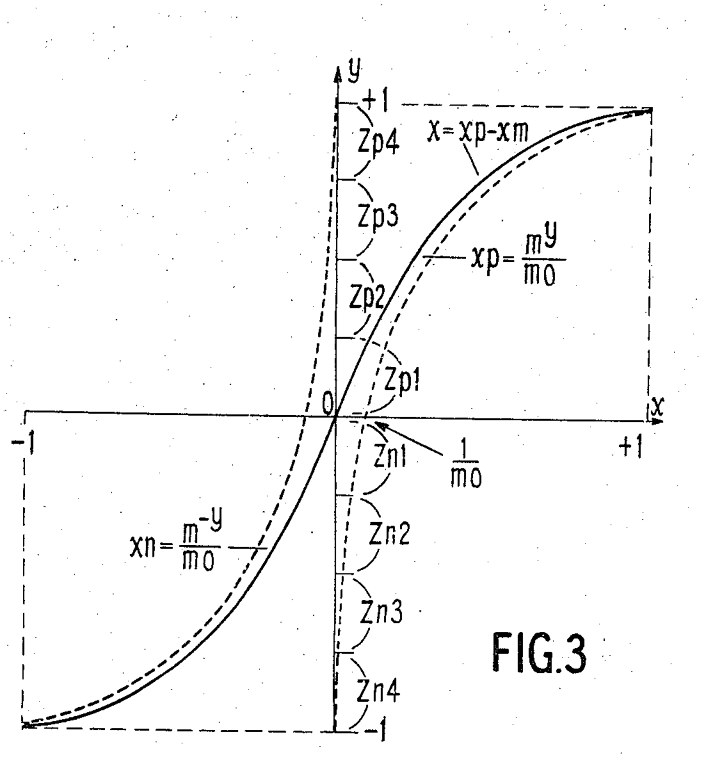
FIG. 3 represents the characteristic curve of the nonlinear decoder according to the invention.

FIG. 3 represents the two curves $xp=f1(y)$ and $xn=f2(y)$ as well as the curve $x=xp-xn$ which constitutes the characteristic curve of the decoder. This curve is obtained by subtracting the values $xp$ and $xn$ for each value of $y$.

In the decoder according to the invention, this substraction is obtained by taking, as normalized decoded signal $x$, the difference potential between the outputs of two circuits supplying respectively the voltages $xp$ and $xn$, these two voltages having the same polarity, positive for instance.

On FIG. 3, the curves representing $x$ and $xp$, for instance, are merged at the point of abscissa and ordinate +1. This is not exactly the case in practice, since, for $y=1$, the equation (3) gives:

$$x=\frac{1}{1-1/m^2}.$$

Nevertheless, the term $1/m^2$ is extremely small (one chooses *f.i.* $m=200$) and may be neglected.

On the contrary, since the two curves $xp$ and $xn$ intersect the abscissae axis at symmetrical points of abscissae $$\pm\frac{1}{mo},$$

the curve $x=xp-xn$ is symmetrical with respect to the point 0 and one has not only $yn=-yp$ but also $xn=-xp$.

2. DESCRIPTION

2.1–General Diagram

Figure 4:
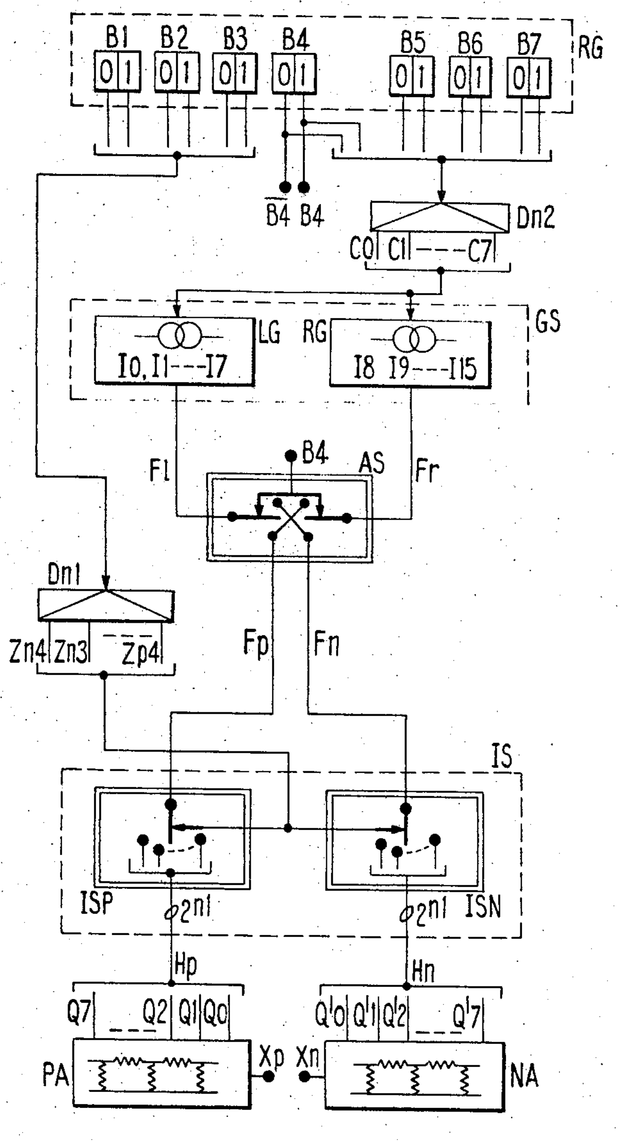
FIG. 4 represents the general diagram of said decoder.

FIG. 4 represents the general diagram of the circuit according to the invention provided for carrying out the nonlinear decoding, according to the law (2), of numbers comprising $n=n+n2$ digits. By way of a nonlimitative example, one will choose to describe a decoder designed for $n=7$, $n1=3$ and $n2=4$.

This circuit comprises:

The register RG comprising $n=7$ flip-flops B1, B2 ... B7 which stores the number A$m$ to be decoded expressed in natural binary code and to which corresponds a voltage $em$ which increases linearly with the value of the code.

The decoder D$n$2 to which are applied the $n2=4$ digits B4, B5, B6, B7 of the number A$m$ and which comprises the $2^{n2-1}=8$ outputs C0 to C7.

The Table IV hereafter gives the correspondence between these signals and the numbers constituted by the digits B4 to B7.

The signals appearing on these outputs C0 to C7 control the primary selection of the decoding parameters.

The current generator unit GS which comprises the group of left-hand side generators LG (generators of current I0, I1 ... I7) and the group of right-hand generators RG (generators of current I8, I9 ... I15). Each of these generators supplies, when it is triggered by a primary selection signal (see table IV, columns 3 and 4), a current bearing the same reference, these currents increasing in geometrical progression of ratio $d1$ starting from the current IO. As it is seen further on, the normalized current supplied by the generator IO has the value $$io=\frac{IO}{I}=m^{1/128}$$

and the value of $d1$ is $m^{1/64}$, I being the reference current. The Table III gives, in the column 3, the normalized values $io$, $i1$ ... $i15$ of the currents supplied by the different generators. It is thus seen that one has $io=m^{1/128}$, $i1=m^{3/128}$, ... $i15=m^{31/128}$;

The secondary selection circuit AS to which are applied the currents supplied by the unit GS and which comprises a bipolar inverter. According to whether the *secondary selection signal* B4 is present or absent, the current supplied by the group of generators LG (RG) is transmitted on the output F$p$ or F$n$ (F$n$ or F$p$).

The current appearing on the output F$p$ (F$n$) is that intended to produce the voltage $xp$ ($xn$).

The decoder D$n$1 to which are applied the $n1=3$ digits B1, B2, B3 of the number A$m$ and which comprises the $2^{n1}=8$ outputs Z$n$4, Z$n$3, Z$n$2, Z$n$1, Z$p$1 ... Z$p$4 characterizing the zones of numbers bearing the same references on the FIG. 3. The signals appearing on these outputs control the *tertiary selection* of the decoding parameters;

The tertiary selection circuit IS which comprises the circuits ISP and ISN receiving the currents supplied by the circuits AS respectively over the conductor F$p$ and over the conductor F$n$. Each of these circuits is constituted by a switch with $2^{n1}$ direction, controlled by the tertiary selection signals. Each of the groups of conductors H$p$ and H$n$ comprises thus $2^{n1}=8$ conductors;

The ladder attenuators PA (positive attenuator) and NA (negative attenuator), comprising each $2^{n1}=8$ injection points Q0, Q1 ... Q7, to which are connected the conductors of the groups H$p$ and H$n$. The output voltages bearing the signs "+" and "–" appear respectively on the output terminals X$p$ and X$n$ of these attenuators.

Figure 5:
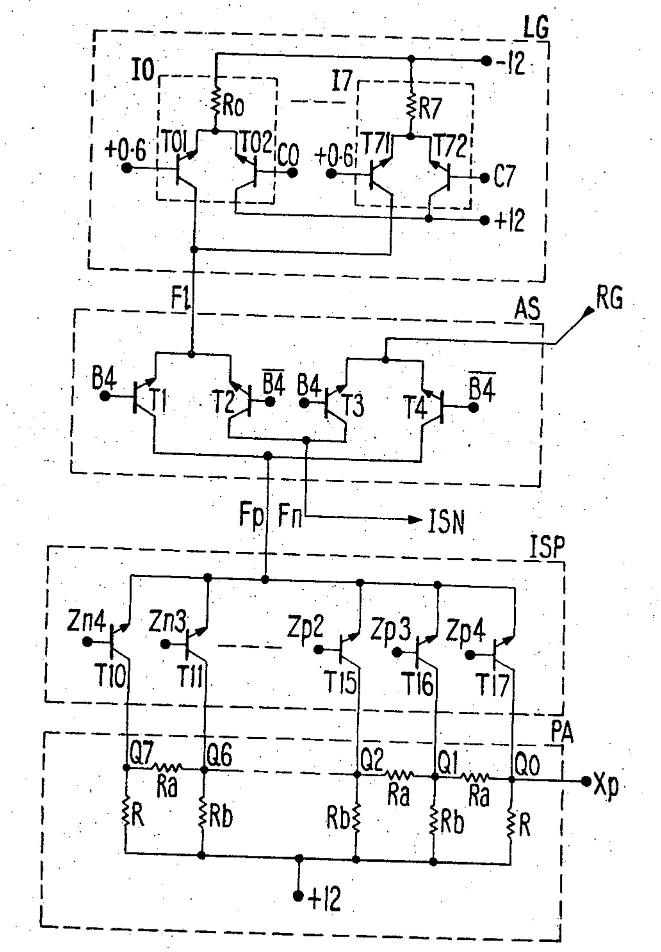
FIG. 5 represents the detailed diagram of a part of said decoder.

FIG. 5 represents the detailed diagram of a part of the decoder of FIG. 4 with the group of generators LG, the circuits AS, ISP and the attenuator PA. The circuits RG, ISN and NA not represented on this FIG. are absolutely identical, respectively, to the circuits LG, ISP and PA.

2.2–Ladder Attenuator

The ladder attenuator PA comprises eight input terminals or injection points, Q0, Q1 ... Q6, Q7, Q$j$. In this circuit, one has designated by:

R the values of the extreme shunt resistances,

R$b$ the values of the other shunt resistances,

R$a$ the values of the series resistances,

Z the value of the characteristic impedance, i.e. the value of the equivalent resistance of the attenuator measured between any one of the points of injection and the common terminal (+12 volts).

It is known that if: $Ra=(d-1)R$ and $$Rb=\frac{dR}{d-1}$$

each cell of this attenuator brings an attenuation $d$ and that said attenuator presents a characteristic impedance $$Z=\frac{dR}{d+1}.$$

Thus, for instance, if one has chosen $d=2$ and if a current I is injected at the point Q0, the output voltage is $Xp=ZI=ZI.2^{0}$. If the same current is injected at the point Q1, the output voltage is $Xp=ZI.2^{-1}$ etc.

Last, if a current I′ is injected, for instance, in Q3 and a current I″ in Q1, one has, in compliance with the superposition theorem:

$$VP=Z(I'^{-3}+I''.2^{-1}).$$

In the present decoder, one has chosen $d=d2=m^{1/4}$ to comply with the nonlinear law of the equation (3). One has thus, for a current $I1=Im^{3/128}$ injected at the point Q2:
$Xp=Z\,.\,I.m^{3/128}.\,m^{1/4}=Z\,.\,I.m^{35/128}$.

2.3–Switching Circuits

The switching circuits represented on FIG. 5 comprise NPN transistors which are either blocked or conducting and it will be said that:

- A transistor is blocked when its base receives a *low level* signal of value zero volt;
- A transistor is conducting when its base receives a *high level* signal of positive polarity.

Besides, it will be assumed that the base-emitter voltage drop in a conducting transistor is of 0,6 volt.

These circuits are:

- The group of current generators LG comprising the generators I0 to I7, each of these latter —such as the generator I0 —being constituted by a current-mode switching circuit with the transistors T01, T02 and the resistance R*o* which fixes the value of the current it supplies. As it may be seen on the FIG., the triggering signal C0 is a low level signal (0 volt). The amplitude of the high level signal (signal $\overline{\mathbf{C0}}$) has been chosen, by way of example, equal to 3 volts.
- The selection circuit AS comprising the transistors T1 to T4, this circuit is controlled by the high level signals B4 or $\overline{\mathbf{B4}}$ delivered by the flip-flop B4 (FIG. 4) according to whether it is in the 1 state or in the 0 state. In the case of the example, the amplitude of these high level signals is of 1,5 volt.
- The selection circuit ISP comprising the transistors T10 to T17 controlled by the high level signals Z*n*4 to Z*p*4 of amplitude 3 volts.

When one of the current generators of the group LG is triggered—the generator I0 for instance—and when a signal B4, for instance, is present, the transistors T1 and T01 are conducting and the potential of the conductor F1 sets at 0,9 volt. However, the decoder D*n*1 delivers also a signal at the same moment, the signal Z*n*4 for instance, so that the transistor T10 is unblocked, that the potential of the conductor F*p* shifts to 2,4 volts, and that the negative current supplied by the generator 10 flows through the transistors T01, T1, T10 and through the characteristic impedance of the attenuator PA developing, at the injection point Q7, a voltage of amplitude Z.10.

3. OPERATION

3.1–CALCULATION OF THE VALUES OF NEGATIVE EXPONENTS

The mode of elaboration of the normalized voltages *xp* and *xn* and *x*, such as they are defined, respectively, by the equations (4), (5) AND (3), will now be studied, in detail.

These voltages are obtained from the symmetrical linear decoding with shift compensation corresponding to the equation:

$y=-1+b+b2.2^{-1}+\ldots\ldots\ldots\ldots b7.2^{-6}+2^{-7}$ (2)

This equation may be written: $y=R+T$ (7)

by setting: $R=(-4+4b1+2b2+b3).2^{-2}=(M-4).2^{-2}$ (8)

$T=(164+8b5+4b6+2b7+1).2^{-7}=(2N+1).2^{-7}$(9).

With:

$M=4b1+2b2+b3$ $N=8b4+4b5+2b6+b7$.

The equations 4′ and 5′ may then be written:

$$xp=\frac{m^{R}\cdot m^{T}}{mo} \quad (4)$$

$$xn=\frac{m^{-R}\cdot m^{-T}}{mo} \quad (5)$$

It is seen that each of these voltages is obtained by making the product of two terms.

In the decoder represented on FIG. 4, the term with the exponent T or −T is supplied—for each of these voltages—by a current generator supplying current in an injection point of one of the generators PA and NA chosen in relation with the value of the term with the exponent R or −R , this operation materializing the product of the tow terms.

In order to determine the value of the negative exponents in the equation (5), the value of *y* in relation with M and N will be first written according to the equations (8) and (9):

$y=R+T=(M-2^{2}).2^{-2}+(2N+1).2^{-7}$ viz: $-y=-(R+T)=(2^{2}-M).2^{-2}-(2N+1).2^{-7}$.

On the other hand, the values $\hat{R}$ and $\hat{T}$ obtained by taking the complement to $2^{n}-1$ (inversion of the binary digits) of the numbers M and N will be calculated:

$\hat{R}=(2^{2}-M-1).2^{-2}$ (10)

$\hat{T}=[2^{5}-(2N+1)].2^{-7}$ (11)

If one writes: $\hat{y}=\hat{R}+\hat{T}=(2^{2}-M-1).2^{-2}+2^{5}-(2N+1)].2^{-7}$
$=(2^{2}-M).2^{-2}-2^{-2}+2^{-2}-(2N+1).2^{-7}$ viz: $-y=\hat{y}$.

It is seen that the sum of the negative values of R and T related to a given number P is equal to the sum of the positive values of R and T related to the complement $\overline{P}$ of this number.

3.2–Elaboration of the Voltages *xp* and *xn*

The Table I gives, in the columns 4 and 5, the values of R and $\hat{R}$ for the values of M (column 1) corresponding to the digits B1–B2–B3 (column 2) which define the various zones (column 3). It is seen from this table and from the equations (8) and (10) that the values of R ($\hat{R}$) increase (decrease) in arithmetic progression of ratio one-fourth. The values of $m^{R}$ ($m^{-R}$) increase (decrease) thus in geometric progression of ratio $d2=m^{1/4}$.

The Table II gives, in the columns 3 and 4, the values of T and $\hat{T}$ for the values of N (column 1) corresponding to the 16 codes of each zone constituted by the digits B4 to B7 (column 2). By examining this table, it is seen that:

- The values of T and $\hat{T}$ vary in arithmetic progression of ratio one-sixty-fourth and that the values of $m^{T}$ and $m^{-T}$ vary thus in geometric progression of ratio $d1=m^{1/64}$.
- The values of T and $\hat{T}$ are identical for codes symmetrical with respect to the center of the zone. These values are those which, as exponents of *m*, give the amplitude of the normalized currents *io*, *i*1, ... *i*15, supplied by the generators of the unit GS (see paragraph 2.1).

Table III is a rearrangement of Table II, in which the column 3 represents the values of the normalized currents supplied by the generators the references of which are shown in column 2.

TABLE I

| M | B1 | B2 | B3 | Zone | R | R̂ |
|---|---|---|---|---|---|---|
| 0 | 0 | 0 | 0 | Zn4 | −1 | −¼ |
| 1 | 0 | 0 | 1 | Zn3 | −¾ | −½ |
| 2 | 0 | 1 | 0 | Zn2 | −½ | −¾ |
| 3 | 0 | 1 | 1 | Zn1 | −¼ | 0 |
| 4 | 1 | 0 | 0 | Zp1 | 0 | −¼ |
| 5 | 1 | 0 | 1 | Zp2 | −¼ | −½ |
| 6 | 1 | 1 | 0 | Zp3 | −½ | −¾ |
| 7 | 1 | 1 | 1 | Zp4 | −¾ | −1 |
| 1 | | 2 | | 3 | 4 | 5 |

TABLE II

| N | B4 | B5 | B6 | B7 | T | T̂ |
|---|---|---|---|---|---|---|
| 0 | 0 | 0 | 0 | 0 | 1/128 | 31/128 |
| 1 | 0 | 0 | 0 | 1 | 3/128 | 29/128 |
| 2 | | | | | | |
| . | . | . | . | . | . | . |
| 7 | 0 | 1 | 1 | 1 | 15/128 | 17/128 |
| 8 | 1 | 0 | 0 | 0 | 17/128 | 15/128 |
| . | . | . | . | . | . | . |
| 14 | 1 | 1 | 1 | 0 | 29/128 | 3/128 |
| 15 | 1 | 1 | 1 | 1 | 31/128 | 1/128 |
| 1 | | 2 | | | 3 | 4 |

TABLE III

| Generators | | | Digits B4 to B7 | | | | | | | |
|---|---|---|---|---|---|---|---|---|---|---|
| Group | Reference | Normalized current | Current injected in PA (T) | | | | Current injected in NA (T) | | | |
| LG | I0 | $m^{1/128}$ | 0 | 0 | 0 | 0 | 1 | 1 | 1 | 1 |
| | I1 | $m^{3/128}$ | 0 | 0 | 0 | 1 | 1 | 1 | 1 | 0 |
| | . | . | . | . | . | . | . | . | . | . |
| | I7 | $m^{15/128}$ | 0 | 1 | 1 | 1 | 1 | 0 | 0 | 0 |
| RG | I8 | $m^{17/128}$ | 1 | 0 | 0 | 0 | 0 | 1 | 1 | 1 |
| | . | . | . | . | . | . | . | . | . | . |
| | I14 | $m^{29/128}$ | 1 | 1 | 1 | 0 | 0 | 0 | 0 | 1 |
| | I15 | $m^{31/128}$ | 1 | 1 | 1 | 1 | 0 | 0 | 0 | 0 |
| 1 | 2 | 3 | 4 | | | | 5 | | | |

The columns 4 and 5 represent the codes for which these currents materialize the terms $m^T$ and $m^{-T}$ and contribute respectively to the elaboration of the voltage *xp* injection of the current in the attenuator PA and to the elaboration of the voltage *xn* by injection of the current in the attenuator NA.

This Table shows that:

a given current generator is set into operation for one of two complementary codes;

the current generators may be distributed into two groups LG and RG, a generator in each group being triggered by a given code.

TABLE IV

| Signal of decoder Dn2 | | Triggered generators | | Current switching | |
|---|---|---|---|---|---|
| Signal | Digits B4 to B7 | LG | RG | Condition B4 | Condition $\overline{B4}$ |
| C0 | 0000 or 1111 | I0 | I15 | LG→PA | LG→NA |
| C1 | 0001 or 1110 | I1 | I14 | | |
| C2 | 0010 or 1101 | I2 | I13 | | |
| . | . | . | . | RG→NA | RG→PA |
| C7 | 0111 or 1000 | I7 | I8 | | |
| 1 | 2 | 3 | 4 | 5 | 6 |

Table IV is another rearrangement of Table II, which shows that two symmetrical generators must be triggered (columns 3 and 4) for each code (column2) and that the value of the digit B4 (columns 5 and 6) determine the current which will contribute to the elaboration of *xp* (injection in PA and that which will contribute to the elaboration of *xn* (injection in NA). As it has been seen in the paragraph 2.1, the pairs of codes shown in column 2 of the table are defined by the primary selection signals C0 to C7 (column 1) and the switching of the currents supplied by the groups of generators LG and RG is controlled by the secondary selection signal B4 to $\overline{B4}$.

Referring to Table I, it is seen that the values of R and R̂, and thus of $m^R$ and $m^{-R}$, vary in opposite direction with eight different values. The terms $m^R$ and $m^{-R}$ of the equations (4) and (5) are thus materialized by the two attenuators PA and NA comprising each eight cells of unit attenuation *d*2. The points of injection of these attenuators (see FIG. 5) are selected by the tertiary selection signals characterizing the zones.

The correspondence between these signals and the points of injection is determined as follows: a code of the zone *Zp*4 for which one has $m^R = m^{3/4}$ (see table I) is taken. According to FIG. 3, *xp* is maximum and *xn* minimum for this code. It results therefrom that the signal *Zp*4 must control the injection of current at the point Q0 of the attenuator PA. For the zone *Zp*3 one has $m^R = m^{1/2}$ and the signal *Zp*3 must control the current injection in Q1, and so on, up to the zone *Zn*4.

For the term $m^{-R}$, one has in the zone *Zn*4: $m^{-R} = {}^{3/4}$; in the zone *Zn*3: $m^{-R} = m^{1/2}$ etc... It results therefrom that the signal *Zn*4 must control the current injection at the point *Qo'* of the attenuator NA, etc..

4. ALTERNATIVE SOLUTIONS

4.1–First Alternative

The equation (2) may be written as follows:

$y = R' + T'$ with $R' = (2M+1-2^3).2^{-3} = f'(M)$ $T' = (2N+1-2^4).2^{-7} = f'(N)$ By taking the complement to $2^n-1$ of the numbers M and N, one has:

$R' = (2^3-2M+).2^{-3} = f'(\overline{M})$ $T' = 2^5-(2N+1).2^{-7} = f'(\overline{N})$.

These four equations show that one has always $d1 = m^{1/64}$ and $d2 = m^{1/4}$.

It is seen that, in this particular mode of writing of the two terms, the sum of which is equal to *y*, the negative values of the terms $f'(M)$ and $f'(N)$ are equal respectively to the positive values of the terms $f'(\overline{M})$ and $f'(\overline{N})$ corresponding to the complement of the numbers M and N.

It will be noted that, as the values of the constants are different, one obtains values of R′ and of T′ different from R and T whereas: $R'+T' = R+T$. Thus, for M=O, one has $R' = -7/8$ and for N=o, one has $T' = -15/128$.

4.2–Second Alternative

The equation (2) may be written as follows:

$y = (-1+2^{-7}) + M.2^{-2} + N.2^{-6}$ with $M = 4b1 + 2b2 + b3$ $N = 8b4 + 4b5 + 2b6 + b7$.

One has: $-y = 1-2^{-7} - M.2^{-2} - N.2^{-6}$ and $\hat{y} = -1+2^{-7} + (2-1-M).2^{-2} + (2^4-1-N).2^{-6}$ One checks, by developing this equation that one has again: $-y = \hat{y}$.

The terms $|(-1+2^{-7})|$ of the voltages *y* and $-y$ becomes a multiplying constant in the voltage *x* which is taken into account during the utilization. In this solution, each cell of the ladder attenuator must still bring an attenuation of $d2 = m^{1/4}$ and the ratio of the geometric progression of the currents supplied by the block GS (FIG. 4) is still $d1 = m^{1/64}$. Nevertheless, owing to the absence, in the term T″, of the constant $2^{-7}$ one has: IO=I, Il=I$m^{1/64}$, etc.. In the same way, owing to the absence in the term R″ of the constant −1, the values of R″ are different from the values of R indicated in the Table I. For instance, for the initial code of the zone *Zn*4, one has R″=0, for the initial code of the zone *Zn*4, one has R″=1/4, etc. There is no modification at all in the selections.

4.3–Generalization

Last the values of *n*1 and *n*2 may be different from those chosen for the circuit described in relation with FIG. 4. In effect, the principle of the distribution of the current generators into two groups of symmetrical generators remains valid as long as $n2$ is higher than one and that these $n2$ digits are adjacent digits. Besides the role of the terms R and T may be reverted, in such a way as the $n1$ most significant digits control the primary and secondary selections and the $n2$ less significant digits control the tertiary selection. In this case, each cell has an attenuation of $m^{1/64}$ and the currents increase in geometric progression of ratio $m^{1/4}$.

While the principles of the above invention have been described in connection with specific embodiments and particular modifications thereof it is to be clearly understood that this description is made by way of example and not as a limitation of the scope of the invention.

We claim:

1. A nonlinear digital-to-analog decoder adapted to decode numbers in a natural binary code with $n=n1+n2$ digits, and having a smooth logarithmic characteristic $y=f(x)$ given by the equation $$x=\frac{m^y-m^{-y}}{m-1/m},$$

wherein $m$ represents the curvature of said characteristic, said decoder comprising a register for receiving and storing digital signals to be decoded, a first decoder circuit for selecting a primary control signal in response to a first group ($n2$) of said digital signals, means responsive to said selected primary control signal for providing currents determined by said first group of digital signals, means for deriving a secondary control signal, means responsive to said secondary control signal to transmit said currents to a tertiary selection circuit, a second decoder circuit responsive to a second group ($n1$) of said digital signals to select a tertiary control signal for controlling said tertiary selection circuits, and ladder attenuators responsive to signals from said tertiary selection circuit to provide analog output signals proportional to the received digital signals.

2. A nonlinear digital to analog decoder as claimed in claim 1, in which the means responsive to said primary control signal includes two current generators for providing currents which increase in magnitude in accordance with the value represented by the first group of digital signals.

3. A nonlinear digital-to-analog decoder as claimed in claim 2, in which a bipolar inverter controls the switching of the currents supplied by the two generators in response to the secondary control signal.

4. A nonlinear digital-to-analog decoder as claimed in claim 3, in which the tertiary selection circuit includes switching means for switching the currents received from the bipolar inverter to the ladder attenuators.

5. A nonlinear digital-to-analog decoder as claimed in claim 1, in which the ladder attenuators are formed by two sets of cells totaling $2^{n1}$ cells bringing an attenuation of $d2=m^{-(n1-1)}$ per cell, one of said sets of cells providing a voltage $$xp=\frac{m^y}{m-1/m}$$

and the other set of cells providing a voltage $$m=\frac{m^{-y}}{m-1/m},$$

whereby the difference is equal to the decoded voltage $x$.

6. A nonlinear digital to analog decoder as claimed in claim 1, in which the register stores a 7-digit code ($n=7$), the first decoder circuit responds to the last four ($n2=4$) of said digits to derive the primary control signal, the secondary control signal is derived from the first of the last four digits, and the second decoder circuit responds to the first three ($n1=3$) of said digits to derive the tertiary control signal.